United States Patent
Hüttenhofer et al.

(10) Patent No.: US 11,398,823 B2
(45) Date of Patent: Jul. 26, 2022

(54) WATER INSENSITIVE CAPACITIVE SENSOR SWITCH

(71) Applicant: CAPTRON Electronic GmbH, Olching (DE)

(72) Inventors: Kilian Hüttenhofer, Munich (DE); Bernhard Christ, Gauting (DE)

(73) Assignee: CAPTRON ELECTRONIC GmbH, Olching (DE)

( * ) Notice: Subject to any disclaimer, the term of this patent is extended or adjusted under 35 U.S.C. 154(b) by 0 days.

(21) Appl. No.: 17/540,765

(22) Filed: Dec. 2, 2021

(65) Prior Publication Data

US 2022/0094360 A1    Mar. 24, 2022

Related U.S. Application Data

(63) Continuation of application No. PCT/EP2020/062376, filed on May 5, 2020.

(30) Foreign Application Priority Data

Jun. 12, 2019 (EP) .................................... 19179739

(51) Int. Cl.
    *H03K 17/96* (2006.01)
(52) U.S. Cl.
    CPC . *H03K 17/962* (2013.01); *H03K 2217/94036* (2013.01); *H03K 2217/96071* (2013.01)
(58) Field of Classification Search
    CPC ............... H03K 17/962; H03K 17/955; H03K 2017/9602; H03K 2017/0613; H03K 2217/94036
    See application file for complete search history.

(56) References Cited

U.S. PATENT DOCUMENTS

| 8,823,393 | B2 | 9/2014 | Aubauer et al. |
| 9,114,060 | B2* | 8/2015 | Ciechanowski ..... A61H 33/005 |
| 10,976,460 | B2* | 4/2021 | Neel ..................... H03K 17/962 |
| 2017/0292712 | A1* | 10/2017 | Alexander ............... H05B 3/74 |

FOREIGN PATENT DOCUMENTS

| DE | 102013013203 A1 | 2/2015 |
| EP | 2079008 A1 | 7/2009 |
| WO | 2006071747 A1 | 7/2006 |

OTHER PUBLICATIONS

PCT International Search Report and Written Opinion, PCT/EP2020/062376, dated Jul. 21, 2020, 16 pages.

* cited by examiner

*Primary Examiner* — Kyung S Lee
(74) *Attorney, Agent, or Firm* — Quarles & Brady LLP; Yakov S. Sidorin

(57) ABSTRACT

A sensor switch including a first sensor electrode and a second sensor electrode at least partially surrounding the first sensor electrode. An evaluation and control circuit of the sensor switch is configured to generate a switch output signal if a first sensor electrode attenuation signal indicates a high signal attenuation, a second sensor electrode attenuation signal indicates a low signal attenuation, and a cross-coupling signal from the first to the second electrode indicates a low cross-coupling.

20 Claims, 11 Drawing Sheets

WATER INSENSITIVE CAPACITIVE SENSOR SWITCH

CROSS-REFERENCE TO RELATED APPLICATIONS

This application is a continuation of the pending International Application No. PCT/EP2020/062376 filed on 5 May 2020 and published as WO 2020/249306 on 17 Dec. 2020, which designates the U.S. and which claims priority from the European Application No. 19179739.8 filed on 12 Jun. 2019 and published as EP 3751740A1 on Dec. 16, 2020. The disclosure of each of the above-identified patent applications is incorporated by reference herein.

BACKGROUND

1. Field of the Invention

The invention relates to a capacitive sensor switch, also interchangeably called a sensor button, which may be used to detect the proximity of an object or body part like a hand to a sensing surface and a sensing and evaluation circuit thereof.

2. Description of Related Art

A touch sensitive switch for cook tops is disclosed in U.S. Pat. No. 8,823,393 B2. Here, an AC signal is coupled into a sensor plate. An evaluation circuit measures the amplitude of the signal. If a human hand or another conductive object is placed into close proximity of the sensor plate, a capacitive current flows between the sensor plate and the hand, thus reducing the amplitude of the AC signal. The evaluation circuit may include a threshold detector and a window comparator to detect a certain change in amplitude and to issue a control signal at an output. A disadvantage is that a conductive liquid, for example water, on the sensor surface may have the same effect. Accordingly, such a liquid may lead to a false triggering of the switch.

In DE 10 2013 013 203 A1 a capacitive sensor with an outer electrode encircling an inner electrode is disclosed. Both electrodes receive individual signals from signal sources. A detection signal is derived from the inner electrode.

SUMMARY

The embodiments are providing a capacitive proximity sensor providing a high immunity against false triggering through a conductive liquid.

In an embodiment, a capacitive sensor switch, which is configured to detect the proximity of an object or body part like a hand to a sensor electrode, may include—in a common plane—a first sensor electrode and a second sensor electrode. The sensor switch further includes a first signal generator capacitively coupled to the first sensor electrode, and a second signal generator capacitively coupled to the second sensor electrode. In an alternative related embodiment, there may be a single signal generator configured to deliver the first signal generator signal and the second signal generator signal. In at least one embodiment, both of these signals may be the same. The capacitive coupling of the signal generator(s) provides a comparatively high coupling impedance between each signal generator and the associated sensor electrode, such that an object approaching a sensor electrode causes an attenuation of the signal at the sensor electrode. An object approaching the first sensor electrode and the second sensor electrode at the same time may in addition to an attenuation produce a cross-coupling of the signals between the first and the second sensor electrode.

The sensor switch further includes a first sensor circuit coupled to the first sensor electrode and a second sensor circuit coupled to the second sensor electrode. The sensor switch may also include an evaluation and control circuit connected to the first sensor circuit and the second sensor circuit. The evaluation and control circuit is configured to receive signals from the sensor circuits and to derive a first sensor electrode attenuation signal (indicating and/or representing a signal attenuation at the first sensor electrode) and a second sensor electrode attenuation signal (indicating and/or representing a signal attenuation at the second sensor electrode). According to one embodiment, the evaluation and control circuit may be further configured to generate a switch output signal if the first sensor electrode attenuation signal shows a higher attenuation than indicated by the second sensor electrode attenuation signal.

The evaluation and control circuit may be configured to generate a water indication signal if the second electrode to ground attenuation signal indicates a high level of attenuation. A high (level of) attenuation may be indicated if the level of the attenuation is above a predetermined high threshold value. Instead or in addition to ground, a reference electrode (which may be integrated into the sensor switch, in at least one case) may serve as reference.

In another related embodiment, the evaluation and control circuit may be further configured to derive a cross-coupling signal indicating and/or representing a signal transmission between the first sensor electrode and the second sensor electrode (or vice versa; that is—in any direction between these sensor electrodes). This cross-coupling signal may be indicative of some common object such as a conductive liquid or a finger touching the first sensor electrode and the second sensor electrode. Only if there is a common object, the transmission is signal high. Here, the transmission signal indicates the high signal level if there is a high conductivity between the first and second sensor electrodes. Such a high signal level may be indicated if the level of the signal is above a predetermined high threshold value. In at least one embodiment, the previously mentioned signals may be attenuation signals at corresponding high level(s) if there is a high attenuation, resulting from a low signal at the first sensor electrode or at the second sensor electrode.

In an embodiment, the first sensor electrode and the second sensor electrode may be coupled to alternatingly receive signals from a signal generator. This arrangement may prevent cross-coupling and improve measurement precision.

In an embodiment, the signal generators may be alternatingly switched on and off, and/or the signal generators may use different signals (which different signals may be distinguished in the sensor circuits and/or the evaluation and control circuit). As a result, this configuration makes it possible to perform, multiple measurements at the same time. Different signals may include different frequencies, and/or different modulations, and/or different encodings.

While simple attenuation measurements at each of the electrodes may be made with the same signal, such a measurement may be impaired by cross-coupling between the electrodes. Therefore, as a person of skill will readily appreciate, a better measurement of the individual attenuations may be made with different signals or one signal being "off" while the other signal is "on", which may be needed for cross-coupling measurement.

In another related embodiment, the evaluation and control circuit is configured to generate the switch output signal if the first sensor electrode attenuation signal indicates a high attenuation and the second sensor electrode attenuation signal indicates a low attenuation. This is independent of the cross-coupling signal. A switch output signal may also be generated, if the first sensor electrode attenuation signal indicates a high attenuation and the second sensor electrode attenuation signal indicates also a high attenuation, but the cross-coupling signal indicates a low cross-coupling.

The evaluation and control circuit may be configured in an embodiment to generate a water indication signal if at least one of the following conditions is met:
  The first sensor electrode attenuation signal indicates a low attenuation, the second sensor electrode attenuation signal indicates a high attenuation, and the cross-coupling signal indicates a low cross-coupling.
  The first sensor electrode attenuation signal indicates a low attenuation, the second sensor electrode attenuation signal indicates a low attenuation, and the cross-coupling signal indicates a high cross-coupling.
  The first sensor electrode attenuation signal indicates a high attenuation, the second sensor electrode attenuation signal indicates a high attenuation, and the cross-coupling signal indicates a high cross-coupling.

In another embodiment, depending on the required reliability of the switch, either a switch output signal may be generated if water is on the switch, or an error signal may be generated to indicate an unclear switch system state, if one of the following conditions is met together with the first sensor electrode attenuation signal indicating a high attenuation:
  The second sensor electrode attenuation signal indicates a low attenuation, and the cross-coupling signal indicates a high cross-coupling, or
  the second sensor electrode attenuation signal indicates a high attenuation, and the cross-coupling signal indicates a low cross-coupling.

In a further embodiment, the second sensor electrode surrounds the first sensor electrode at at least 50%, preferably at 70% of its circumference.

In another embodiment, the second sensor electrode completely surrounds the first sensor electrode.

In a further embodiment, the evaluation circuit has a dynamic threshold to detect an increasing electrical load to the at least one sensor electrode.

In an embodiment, the AC or RF signal may be in the frequency range of a few kHz to 5 MHz. The signal may have a rectangular or a sinusoidal shape, and preferably it is a spread spectrum signal. Such a spread spectrum signal may be a sequential signal providing a pseudo noise sequence. For different electrodes, different noise sequences may be used. This avoids any interference between neighboring electrodes.

In a further embodiment, the sensor circuit may be completely or at least in part implemented in a microcontroller. This provides lower cost and higher flexibility.

In the described embodiments, terms such as high or low attenuation or high or low cross-coupling refer to, describe, and are defined by normal idle states of the sensor switch as understood by a person of ordinary skill in the art. Specifically, in a normal idle state without water and without a finger touching the switch, the attenuation of the signal is low (or, at a low level), and the cross-coupling is also low (or, at a low level). If water or a finger is on or at the switch, attenuation and/or cross-coupling will increase to a high level (or higher level). To detect such changes to high or higher levels, the normal state of the switch signals may be monitored and/or stored or filtered by a lowpass filter, as a person of skill will recognize.

Herein, a high attenuation or high cross coupling may be indicated or detected if the attenuation of a signal (e.g. at least one of first sensor electrode attenuation signal, second sensor electrode attenuation signal, and cross-coupling signal) is above a predetermined high threshold value and a low attenuation or cross coupling may be indicated or detected if the attenuation or cross coupling of a signal (e.g. at least one of first sensor electrode attenuation signal, second sensor electrode attenuation signal, and cross coupling signal) is below a predetermined low threshold value. Generally, the low threshold value may be lower or equal to the high threshold value.

In an embodiment, the second sensor electrode is arranged between ground and the first sensor electrode.

In at least one embodiment, the evaluation circuit has a dynamic threshold to detect an increasing electrical load to the at least one sensor electrode.

In at least one embodiment, the coupling capacitance between the first signal generator and the first sensor electrode is selected such that a comparatively high coupling impedance results, such that an object approaching the first sensor electrode causes an attenuation of a signal at the first sensor electrode; and/or a coupling capacitance between the first signal generator or a second signal generator and the second sensor electrode is selected such that a comparatively high coupling impedance results, such that an object approaching the second sensor electrode causes an attenuation of the signal at the second sensor electrode.

In an embodiment, the first signal generator and the second signal generator are alternatingly switched on and/or use different signals.

In an embodiment, the first sensor electrode and a second sensor electrode are coupled to alternatingly receive signals.

BRIEF DESCRIPTION OF THE DRAWINGS

In the following, the invention will be described by way of example, without limitation of the general inventive concept, on examples of embodiment and with reference to the drawings.

FIG. 9 shows a further evaluation circuit.

Figure 1:
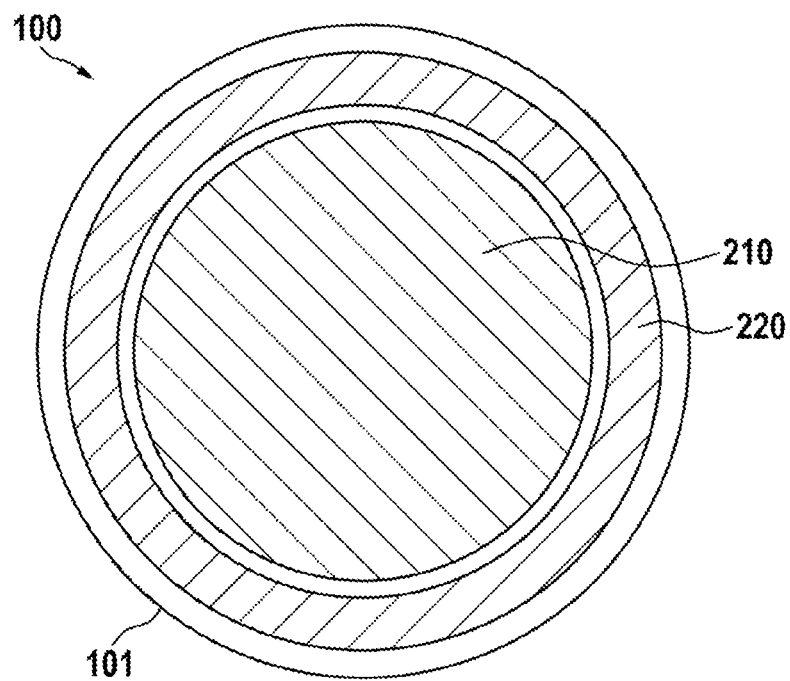
FIG. 1 shows a top view on a sensor switch.

Generally, the drawings are not to scale. Like elements and components are referred to by like labels and numerals. For the simplicity of illustrations, not all elements and components depicted and labeled in one drawing are necessarily labels in another drawing even if these elements and components appear in such other drawing.

While various modifications and alternative forms, of implementation of the idea of the invention are within the scope of the invention, specific embodiments thereof are shown by way of example in the drawings and are described below in detail. It should be understood, however, that the drawings and related detailed description are not intended to limit the implementation of the idea of the invention to the particular form disclosed in this application, but on the contrary, the intention is to cover all modifications, equivalents and alternatives falling within the spirit and scope of the present invention as defined by the appended claims.

DETAILED DESCRIPTION

In FIG. 1, a top view on a sensor switch 100 is shown. The sensor switch 100 has a housing 101 and a first sensor electrode 210 which is surrounded by a second sensor electrode 220. Both sensor electrodes are in a common plane (arranged in the same plane). In a further embodiment, the second sensor electrode 220 is arranged between ground 190 and the first sensor electrode 210. This may be the case, if the switch is mounted in or on a grounded surface. There may also be a ground ring or ground plane at least partially surrounding the sensor electrode.

Figure 2:
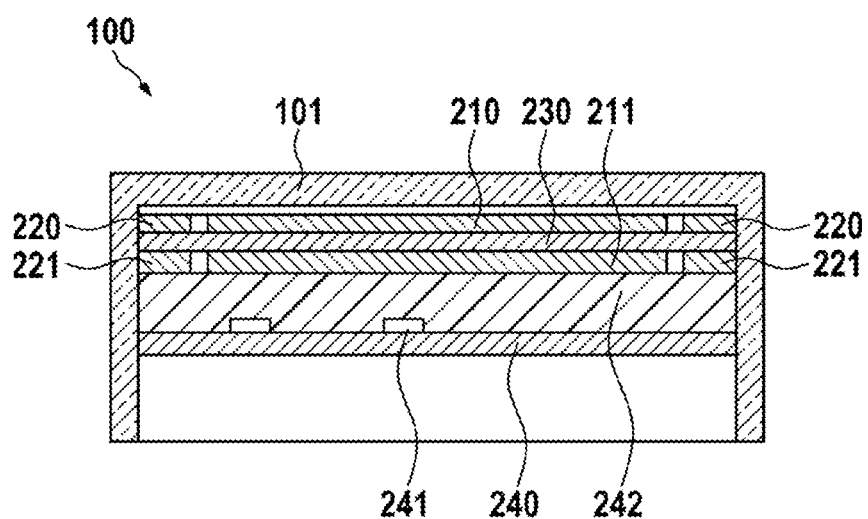
FIG. 2 illustrates a sectional side view of the sensor switch.

FIG. 2 shows a sectional side view of the sensor switch of FIG. 1. The housing 101 preferably has a cup shape. The housing 101 holds the first sensor electrode 210 and the second sensor electrode 220, which are preferably arranged on or are part of a printed circuit board 230. Preferably, close to the first sensor electrode 210, a first signal electrode 211 is arranged and a second signal electrode 221 is in close proximity to the second sensor electrode 220. Preferably, the sensor electrodes and the signal electrodes are on different sides of a printed circuit board or at least insulated by an insulating layer of a printed circuit board. Below, preferably a second printed circuit board 240 is held by a mold 242. The second printed circuit board holds electronic components 241 for signal filtering, amplification and evaluation. It may also be possible to include all components on a single printed circuit board, preferably a multi-layer printed circuit board.

Figure 3:
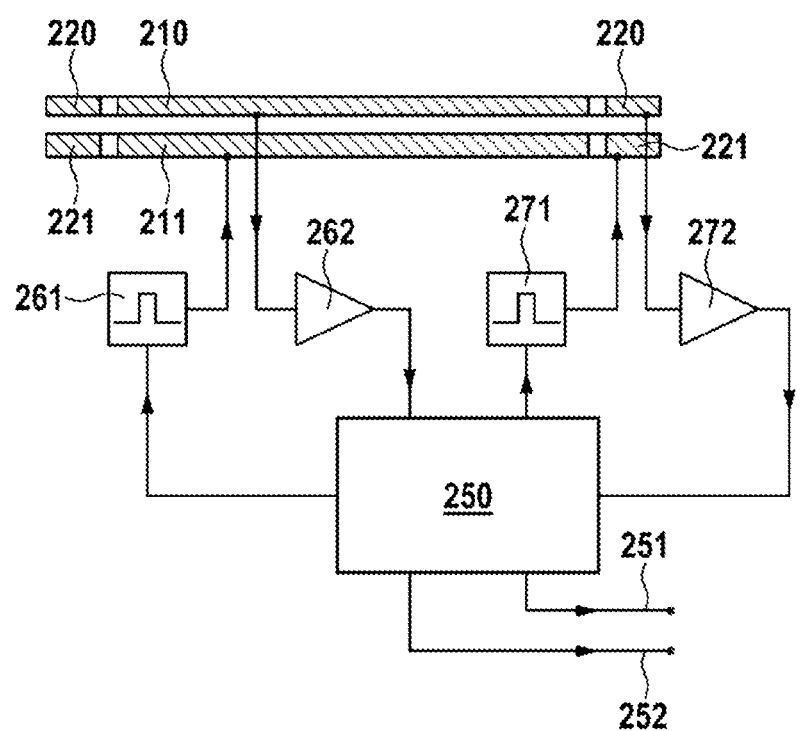
FIG. 3 depicts a circuit diagram of a sensor switch.

FIG. 3 shows a circuit diagram of a sensor switch 100. A first signal generator 261 is connected to the first signal electrode 211 and provides an AC signal which may be in the frequency range of a few kHz to 5 MHz. The signal may have a rectangular or a sinusoidal shape, and preferably it is a spread spectrum signal. Such a spread spectrum signal may be a sequential signal providing a pseudo noise sequence. For different electrodes, different noise sequences may be used. This avoids any interference between neighboring electrodes. The first signal electrode 211 is arranged in close proximity to the first sensor electrode 210 and therefore couples the signal from the first signal generator 261 into the first sensor electrode 210. The coupled signal is processed by a first sensor circuit 262, which provides an output signal into the control circuit 250. A sensor circuit may include a filter like a bandpass filter or a lowpass filter. It may also include at least one of an amplifier, a rectifier, a synchronous rectifier and/or other signal processing means. The sensor circuit generates an analog signal corresponding to the signal amplitude at a sensor amplitude. The sensor circuit may be controlled and/or synchronized by the control circuit 250 and/or any of the signal generators.

A second signal generator 271 (which may generate basically the same signals as the first signal generator 261) is connected to the second signal electrode 221 which is in close proximity to the second sensor electrode 220. The signal from the second sensor electrode 220 is processed via second sensor circuit 272 providing an output signal into control circuit 250. The control circuit 250 may also control the first signal generator and/or the second signal generator in either their signal form or frequency, or it may the switch the signal generators on or off.

The control circuit may provide several signals at its output. For example, there may be a switch signal 251, indicating that the sensor switch has been touched by a finger. There may also be an error signal 252 which may either indicate that the switch is in an undefined state, and/or that the switch is covered with water. There may be multiple error signal lines signaling different error states. At least one of the switch signal line and/or error signal line may also be a bus providing a serial data signal indicating a switch condition.

As will be shown later, the circuit shown here provides a complex evaluation of the signals detected at the first sensor electrode 210 and at the second sensor electrode 220. The table below indicates different types of measurements:

| Signal | S1 | S2 | E1 | E2 |
|---|---|---|---|---|
| First electrode to ground | On | Off | On | Off |
| Second electrode to ground | Off | On | Off | On |
| First electrode to second electrode | On | Off | Off | On |
| Second electrode to first electrode | Off | On | On | Off |

This table shows how basically four different signals may be measured. In the table, the first column specifies the type of signal. The following columns specify the required measurement conditions. The column with header "S1" indicates whether the first signal generator 261 is on or off. The second column with "S2" indicates whether the second signal generator 271 is on or off. The third column with header "E1" indicates whether the signal of the first sensor electrode 210 is evaluated (on) or not (off). The fourth column with header "E2" indicates whether the signal of the second sensor electrode 220 is evaluated (on) or not (off). Instead of or in addition to switching the signal generators on and/or off, the signal generators may use different signals which may be distinguished in the sensor circuits and/or the evaluation and control circuit. So, multiple measurements may be made at the same time. Different signals may include different frequencies, different modulations or different encodings.

While simple attenuation measurements at each electrode may be made with the same signal, such a measurement may be impaired by cross-coupling between the electrodes. Therefore, a better measurement of the individual attenuations may be made with different signals or one signal off while the other signal is on. Such different signals or one signal off while the other signal is on, may be needed for cross-coupling measurement.

The first row describes how the signal from the first electrode to ground is measured. Here, the first signal generator 261 is switched on, the second signal generator 271 is switched off. Only the signal of the first sensor electrode 210 is evaluated. The signal of the second sensor electrode 220 is ignored.

The second row shows how a signal of the second electrode to ground is measured. Here, the first signal generator 261 is off, while the second signal generator 271 is on. Only the signal of the second sensor electrode 220 is used, while the signal of the first sensor electrode is ignored.

The last two rows indicate cross-linked measurements from the first sensor electrode 210 to the second sensor electrode 220, or vice versa. For measuring the cross-coupling from the first sensor electrode 210 to the second sensor electrode 220, the first signal generator 261 is on, and the second signal generator 271 is off. Now, the signal of the second sensor electrode 220 is evaluated and the signal of the first sensor electrode is ignored.

In the last case, a measurement from the second sensor electrode 220 to the first sensor electrode 210 is made. Here, the first signal generator 261 is off, while the second signal generator 271 is on. Furthermore, the signal of the first sensor electrode 210 is measured and the signal of the second sensor electrode 220 is ignored. Basically, the last two cross-linked measurements should have the same results, such that a comparison of these results may be used for estimating the measurement quality and the reliability status of the circuit.

As will be shown later, for evaluation at least the first and the second measurement shown in the table are required. There may be used at least one of the cross-linked measurements shown in the third and fourth row of the table. Normally, these measurements may be made in sequence, for example starting with the first measurement of the table continuing to the second followed by the third. Of course, there may be any other sequence. It is not necessary to measure all the time. Instead, short measurements may be made with longer pause intervals in-between. This may reduce the electromagnetic radiation. On the other hand, a long-term measurement running all the time may result in a higher precision and resolution, as averaging or integration may be made to reduce background noise.

When using spread spectrum signals, the measurement may also be made at the same time by using different or shifted codes. Here, the different types of signals and measurements may be distinguished by the codes as shown in the table below. It is assumed that the first signal generator 261 generates a first code (C1) and the second signal generator 271 generates a second code (C2) which is distinguishable over the first code. An example is shown in the table below:

| Signal | S1 | S2 | E1 | E2 |
| --- | --- | --- | --- | --- |
| First electrode to ground | C1 | C2 | C1 | — |
| Second electrode to ground | C1 | C2 | — | C2 |
| First electrode to second electrode | C1 | C2 | C2 | — |
| Second electrode to first electrode | C1 | C2 | — | C1 |

A signal from a first electrode to ground may be measured by evaluating the first code C1 from the first sensor electrode 210 (E1). The signal from the second sensor electrode 220 is ignored. The signal of the sensor electrode to ground may be evaluated by ignoring the signal from the first sensor electrode 210 and evaluating the signal of the second sensor electrode 220 and thereby evaluating code C2. The signal of the first sensor electrode to the second sensor electrode may simply be measured by evaluating from the first sensor electrode 210 the signal C2. The signal from the second sensor electrode to the first sensor electrode may be measured by evaluating the signal C1 coming from the second sensor electrode 220. Of course, if a signal generator is not used at any time, it may be switched off.

Figure 4:
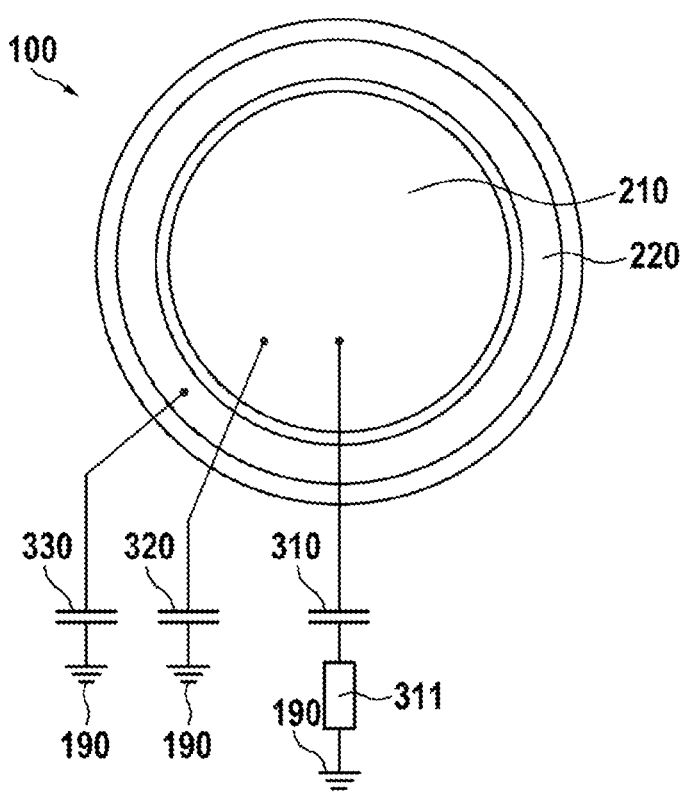
FIG. 4 presents the capacitive coupling effects.

FIG. 4 shows the capacitive coupling effects to the first sensor electrode and the second sensor electrode. During normal operation, the first sensor electrode 210 may be touched by a body part, preferably by the finger of a person. This finger is electrically connected to the body of the person and further connected to the ground on which the person usually stands. The electrical properties of this circuit body with a finger may be modeled by a series capacitor 310 indicating the body capacitance and a series resistor 311 modeling the body resistance of the person which is further connected to ground 190. This circuit forms a bypass and reduces the signal voltage at the first sensor electrode 210. To close the circuit to ground, the circuit shown above usually has a ground connection via a power ground line or a capacitor to ground. Such a ground capacitor may for example be implemented by using a larger metal section at the housing of the sensor switch.

Now turning to a condition where water is at least partially on the surface of the sensor switch. If water only partially covers the second sensor electrode 220 but not the first sensor electrode 210, there is only a second water capacitance 330 to ground. If there is more water which further touches at least partially the first sensor electrode 210, there is also a first water capacitance 320 to ground 190. The first water capacitance further provides a bypass in parallel to the body capacitance 310 and the body resistance 311, further reducing the signal amplitude at the first sensor electrode 210, and therefore providing a higher attenuation of the signal at the first sensor electrode 210. The second water capacitance 330 also provides an attenuation to the signal of the second sensor electrode 220, resulting in a lower signal voltage thereon.

Figure 5:
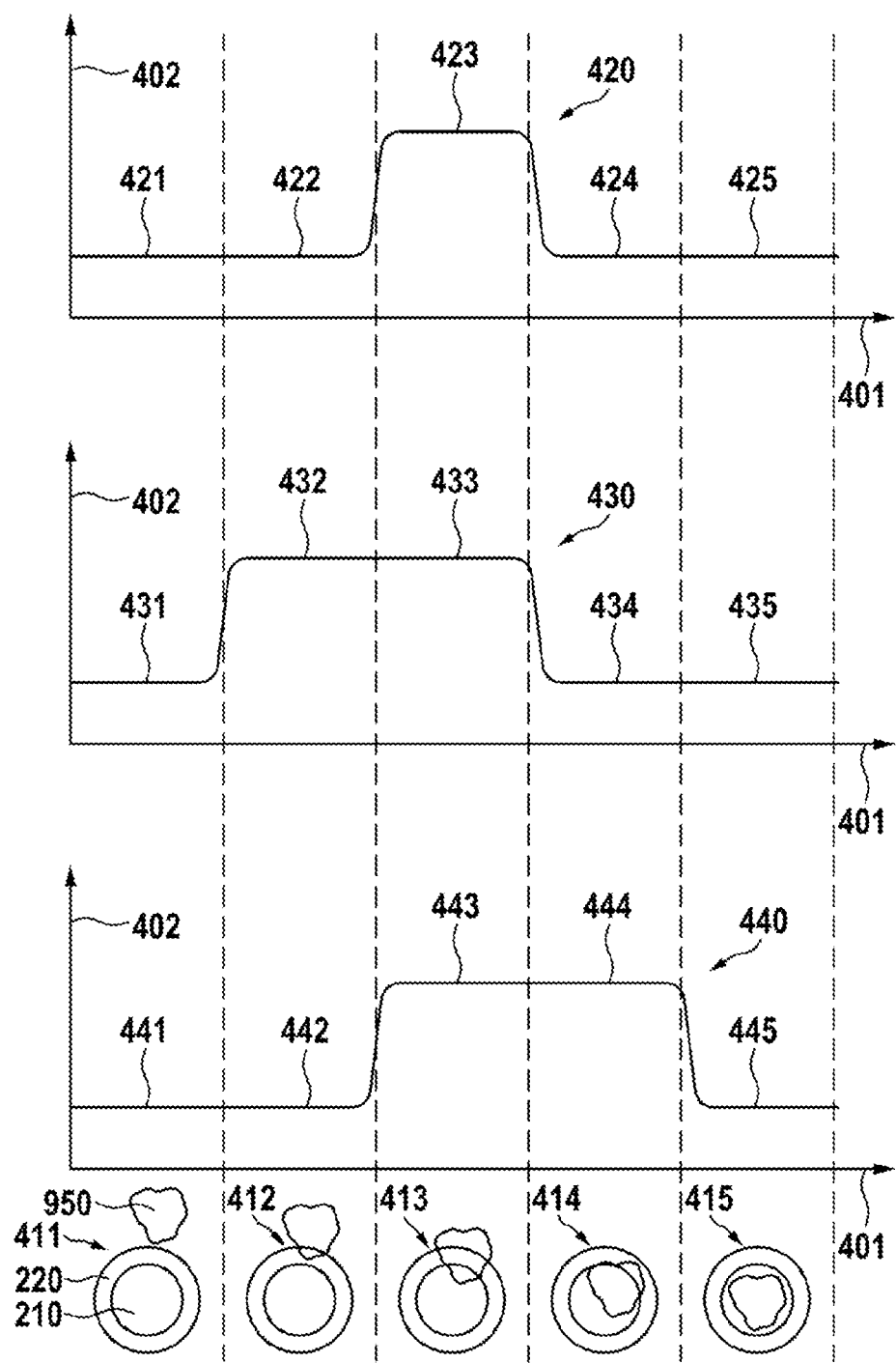
FIG. 5 shows diagrams of sensor signals.

In FIG. 5, diagrams of the signals from the first sensor electrode 210 and the second sensor electrode 220 are shown. These signals may be the output signals of evaluation circuits 702 as will be shown later.

The first diagram 420 including curve sections 421, 422, 423, 424 and 425 shows the capacitive sensor signal of the first electrode 210 measured with respect to ground. The second diagram 430 including curve sections 431, 432, 433, 434 and 435 shows the capacitive sensor signal of the second electrode 220 measured with respect to ground. The area outside of the second sensor electrode 220 is considered at ground. Here, a grounded metal plate would result in lowest possible ground impedance, but experience has shown, that most other commonly used materials work. Even an insulating dielectric layer normally provides sufficient ground coupling, although here, the change in signal amplitude is smaller. The third diagram 440 including curve sections 441, 442, 443, 444 and 445 shows the capacitive sensor signal of the second electrode 220 measured with respect to the first electrode 210. For all diagrams a higher attenuation of signal generates a higher signal value. Therefore, in general, a conductive object or body part approaching the sensor conductor will lead to an increase in signal voltage. The signal is shown along a time axis 401 to the right and along a voltage axis 402 to the top, with increasing time to the right and increasing voltage to the top.

The symbols 411, 412, 413, 414 and 415 at the bottom of the diagram show different states of a drop of water 950 flowing over a switch surface.

In the symbol 411 the drop of water 950 is outside of the switch. Here, the sensor is clear of any surrounding object, such that the curve sections 421, 431 and 441 show no attenuation.

In the symbol 412, the drop of water has just reached the second sensor electrode 220 and therefore provides a capacitive coupling from the second sensor electrode 220 to ground 190. This results in an increased attenuation of the signal and therefore in a higher signal at the output, as shown in curve section 432. The attenuation at the first sensor electrode 210 is not changed and accordingly, the curve sections 422 and 442 remain unchanged at a low level.

In the symbol 413, the drop of water now partially covers the first sensor electrode 210 and the second sensor electrode 220, while still maintaining coupling to ground. This results in a high attenuation in curve section 423 at the first sensor electrode 210, in curve section 433 at the second sensor electrode 220, and also between the first sensor electrode 210 and the second sensor electrode 220.

The symbol 414 shows the water now completely on the sensor switch, partially covering first sensor electrode 210 and second sensor electrode 220. As neither of the sensor electrodes is coupled to ground by the water, the attenuation with respect to ground is low, and therefore curve sections 424 and 434 show a low signal. Capacitive coupling between the first sensor electrode 210 and the second sensor electrode 220 is still provided by the water, and therefore the attenuation of the signal measured between these electrodes is still high, resulting in a higher signal in curve section 444.

In symbol 415, the water is completely over the first sensor electrode 210, and therefore does not provide any capacitive coupling to either the second sensor electrode 220 or ground 190. Therefore, there is no attenuation which is illustrated by curve sections 425, 435, and 454 which all are on a low level.

If the drop would pass the switch further downwards, there would be again the same sequence, but in reverse order, starting from symbols 414 over 413 via 412 and ending at 411. Flowing of water over the switch surface may easily be detected by checking for the shown sequence of the signals or a reverse sequence, or both. A body part or finger 910 is normally placed at the center of the switch to actuate the switch, resulting in a higher attenuation at the first sensor electrode 210 which would result in an attenuation signal as shown in curve section 423, but with low attenuation levels in curves 430 for the second sensor electrode and in curve 440 between the first and the second sensor electrode. If there is water at least partially covering the sensor switch, either diagram 430 would indicate a higher attenuation, or diagram 440 would indicate a higher attenuation. The states of symbols 411 and 415, where water is either completely outside of the switch, or completely within the first sensor electrode's area, may not be detected. This is no problem, because they are not relevant. Touching of the first sensor electrode by a finger with water only on the first sensor electrode would not result in a different signal than touching the sensor electrode without water in the switch's environment.

The following table shows the possible combinations of signals and the detectable events:

| Signal | N | F | W | E | W | E | E | W |
|---|---|---|---|---|---|---|---|---|
| First electrode to ground | Low | High | Low | High | Low | High | Low | High |
| Second electrode to ground | Low | Low | High | High | Low | Low | High | High |
| First electrode to second electrode | Low | Low | Low | Low | High | High | High | High |

The first row shows the states of high attenuation or low attenuation for the first electrode to ground as shown in the first diagram 420. The second row shows the attenuation of the second electrode to ground as shown in the second diagram 430. The third row shows the cross coupling signal of the first electrode to the second electrode as shown in the third diagram 440. The table has eight columns, each column showing a combination of the three low or high signals. The detection state is symbolized by a single letter in the column header. Letter "N" means no detection. This is only the case, if all three signals have a low attenuation. The letter "F" stands for a finger detection, which is only the case if the first electrode to ground has a high attenuation, the second electrode to ground has a low attenuation and the first electrode to second electrode has a low cross coupling. The letter "W" stands for water detection, which is the case for combinations of low/high/low, low/low/high, and high/high/high. The combinations marked with "E" normally may not occur and may be used to indicate a switch error condition. An example of such an error condition may be if the first electrode has a high attenuation to ground and the second electrode has a high attenuation to ground, and the attenuation between the first electrode and the second electrode is low. Such a state may only be reached by placing wires between the sensor electrodes and ground, or if a finger and water are on the switch at the same time.

If a lower reliability of detection may be accepted, the following detection table may be used:

| Signal | N | F | W | F | W | F | E | W |
|---|---|---|---|---|---|---|---|---|
| First electrode to ground | Low | High | Low | High | Low | High | Low | High |
| Second electrode to ground | Low | Low | High | High | Low | Low | High | High |
| First electrode to second electrode | Low | Low | Low | Low | High | High | High | High |

This table is based on the previous table, but the results of some columns are modified. In an embodiment, the combination of high/high/low may also be considered as a finger detection instead of an error, as this may with a high probability only occur if a finger touches the first electrode and if water generates a low impedance from the second electrode to ground. If the finger does not touch the water, then there may be a higher impedance and therefore a lower attenuation between the first electrode and the second electrode via the common ground path. In a further embodiment, the combination high/low/high may be also be considered as a finger detection without any water, but a finger touching the first electrode and the second electrode, which may lead to a some-what higher ground impedance and therefore a lower attenuation at the second electrode compared to the first electrode.

Figure 6:
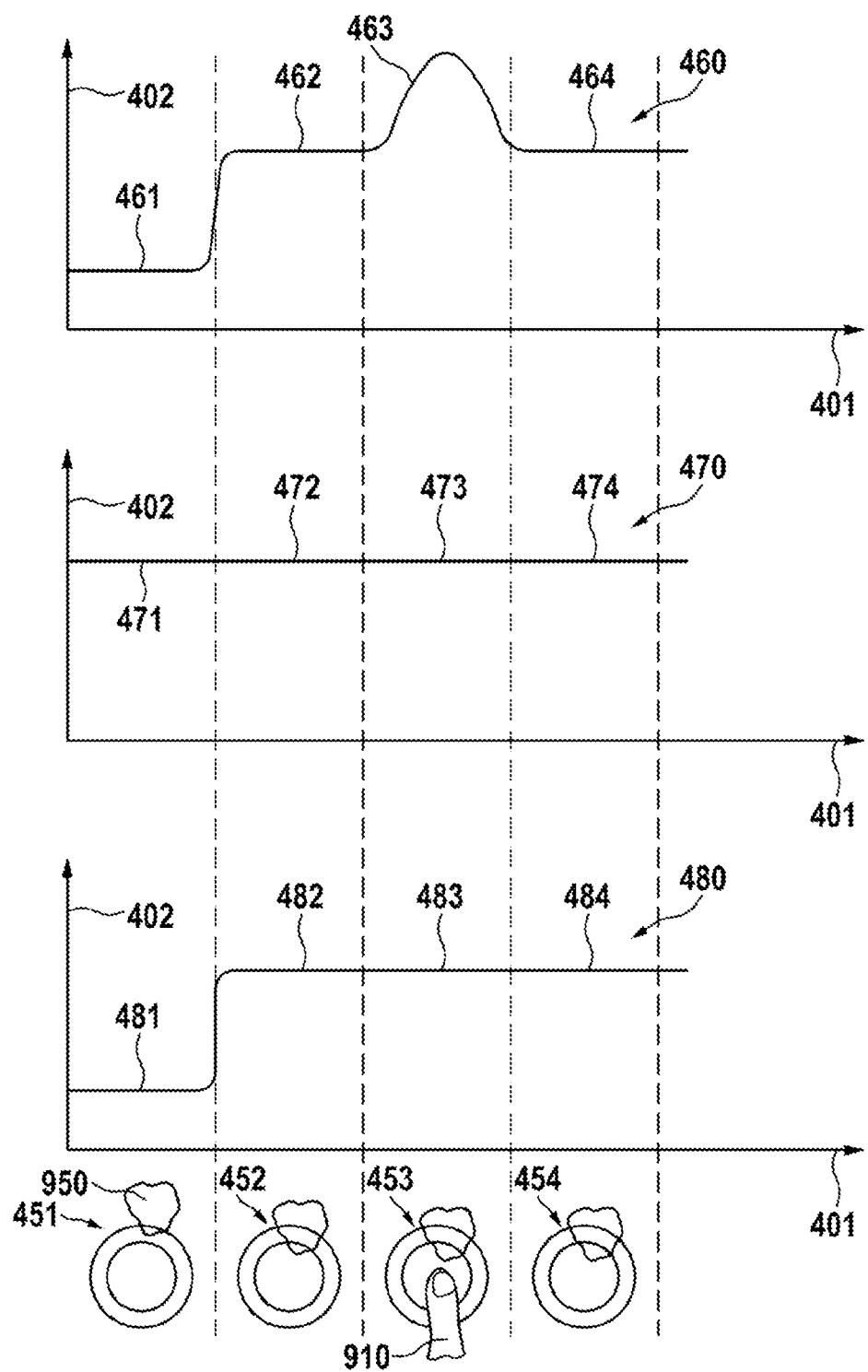
FIG. 6 shows further diagrams of sensor signals.

In FIG. 6, basically the same diagrams are shown as in the previous Figure, but at different operating states.

The first diagram 460 including curve sections 461, 462, 463, and 464 shows the capacitive sensor signal of the first electrode 210 measured with respect to ground. The second diagram 470 including curve sections 471, 472, 473, and 474 shows the capacitive sensor signal of the second electrode 220 measured with respect to ground. The third diagram 480 including curve sections 481, 482, 483, and 484 shows the capacitive sensor signal of the second electrode 220 measured with respect to the first electrode 210.

The symbols 451, 452, 453, and 454 at the bottom of the diagram show different states of a drop of water 950 flowing over a switch surface. Symbol 453 shows an additional finger 910 at the first sensor electrode.

Symbol 451 correlates with symbol 412 and the resulting signal states are the same. Furthermore, symbols 452 and 454 are the same as symbol 413, further resulting in the same signal states. Symbol 453 is similar, but with a finger 910 touching the first sensor electrode. This results in similar states of the second and third sensor signals, namely on the signal of the sensor electrode to ground showing a high attenuation, and the sensor signal of the first electrode to second electrode also showing a high attenuation, simply caused by the drop of water. The high attenuation of the first electrode to ground caused by the drop of water is further increased by the additional attenuation of the finger. Therefore, approaching of a finger to the sensor switch may be detected by detecting a further increase of attenuation from the first electrode to ground, whereas the second electrode to ground has a comparatively constant high attenuation and the signal of the first electrode to the second electrode has a comparatively constant attenuation. This is under the assumption that the drop of water maintains a constant position or moves slowly compared to the finger.

Figure 7:
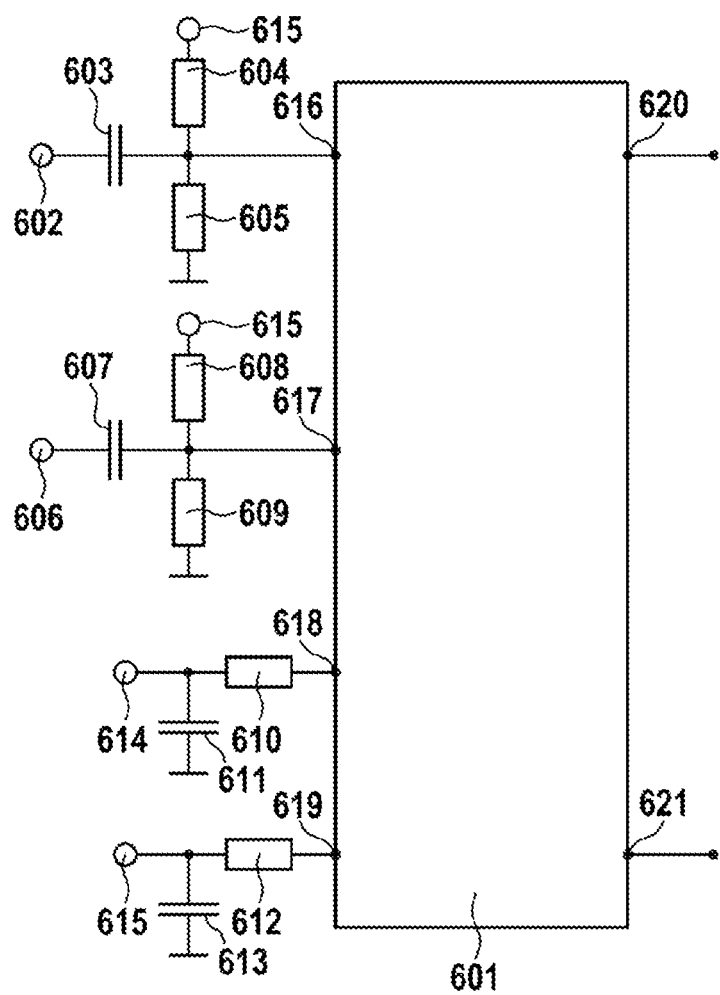
FIG. 7 shows a simple embodiment based on an integrated microcontroller.

FIG. 7 shows a simple embodiment based on an integrated microcontroller 601. The microcontroller has a first analog input which may internally be connected to an analog-to-digital converter. The first analog input 616 may be coupled via a capacitor 603 to an input pin 602. There may be a biasing network of a first resistor 604 connected to a bias voltage 615, and a second resistor 605 connected to ground. The microcontroller may have a second analog input 617, similar to the first analog input 616. The second analog input 617 may be connected via a capacitor 607 to a second input pin 606. Also here may be a bias network of a first resistor 608 connected to a bias voltage 625, and a second resistor 609 connected to ground.

The microcontroller may have a first analog output which may be driven by a pulse width modulator. The first analog output 618 may be connected via a series resistor 610 to a parallel capacitor 611 which is connected to ground. The common point of the resistor and the capacitor may form an analog output pin 614. There may be a second analog output 619 similar to the first analog output 618. This second analog output 619 may be connected via a series resistor 612 to a parallel capacitor 613 which is connected to ground. The common point of the resistor and the capacitor may form an analog output pin 615.

Furthermore, the microcontroller may have at least one digital output 620, 621 which may either be simple digital outputs for forming a logic zero or logic one level. Alternatively, these may be bus or network inputs and/or outputs.

Input pins 602, 606 may be connected directly to the first sensor electrode 210 and the second sensor electrode 220 or to any filtering and/or sensor circuit delivering signals from the sensor electrodes. The output pins 614, 615 may be connected directly or via filtering and/or amplifying means to the first signal electrode 211 and the second signal electrode 221.

Figure 8:
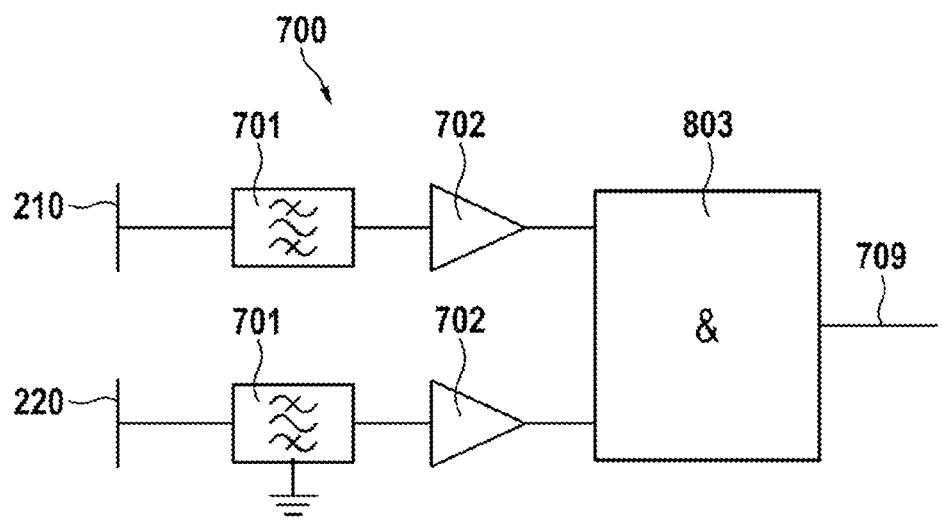
FIG. 8 illustrates a simple evaluation circuit.

In FIG. 8, a simple evaluation circuit 700 is shown. It has two inputs. A first input is the first sensor electrode 210, and a second input is the second sensor electrode 220. Both sensor electrodes may each be connected to a bandpass filter 701, which preferably refers to ground 190. Each of the bandpass filters is followed by a sensor circuit 702 which may include a threshold detector. The output signals of the sensor circuits 702 are combined by a combining circuit 803, forming an output signal 709. Preferably, the circuit derives the signal of coupling from the first electrode to the second electrode from the input signals and generates at least a finger present indication preferably according to one of the tables shown above. If only the two input signals are used without deriving the third input signal, the decision table may be as follows:

| Signal | N | F | W | W |
|---|---|---|---|---|
| First electrode to ground | Low | High | Low | High |
| Second electrode to ground | Low | Low | High | High |

Here, also a Finger detection signal may be indicated if the first electrode to ground attenuation is higher than the second electrode to ground attenuation. Preferably it is at least 20% and most preferably at least 50% higher.

Figure 9:
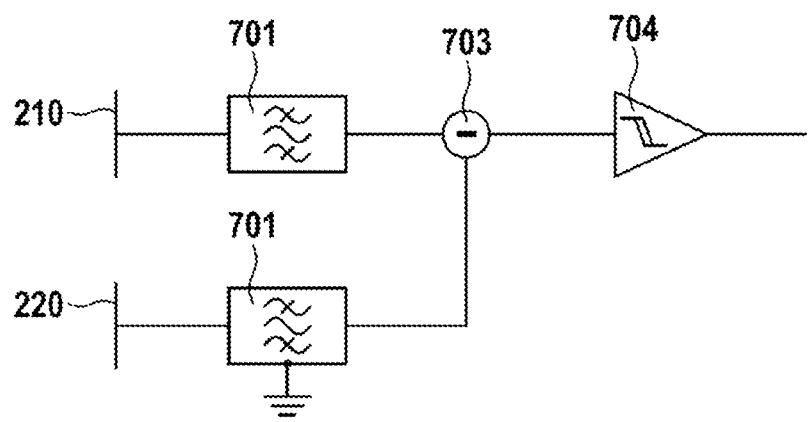
FIG. 9 shows a modified evaluation circuit.

In FIG. 9, a further modified evaluation circuit is shown. Here, after the bandpass filters, a subtracting circuit 703 is provided for generating the difference of the signals from the first sensor electrode and the second sensor electrode. This difference is fed into a threshold comparator 804 for generating an output signal.

Figure 10:
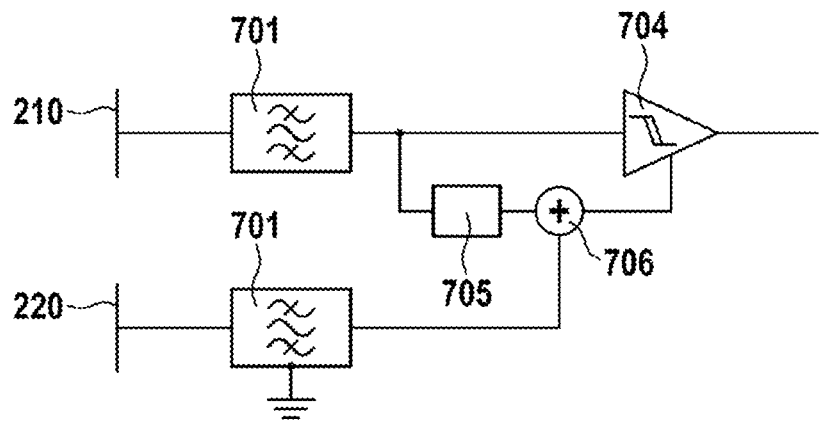
FIG. 10 shows a further modified evaluation circuit.

In FIG. 10, a further modified evaluation circuit is shown. Here, a lowpass filter 705 is provided between the bandpass filter 701 connected to the first sensor electrode 210 and the adder 706. This generates a dynamic signal dependent threshold. Dependent on the signal configuration, the adder 706 may also add inverted signals (subtract signals).

Figure 11:
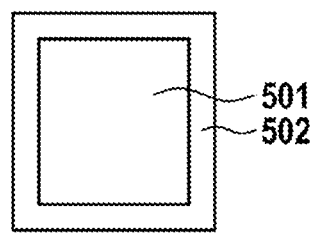
FIG. 11 shows an embodiment with a squared shape.

FIG. 11 shows an embodiment with a squared shape. The first sensor electrode 501 has equal length sides and forms a square. It is surrounded by the second sensor electrode 502 forming a larger square.

Figure 12:
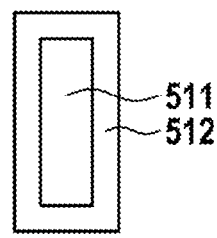
FIG. 12 shows a rectangular embodiment.

FIG. 12 shows a rectangular embodiment. The first sensor electrode 511 has a rectangular shape. It is surrounded by second sensor electrode 512, which also has a rectangular shape.

Figure 13:
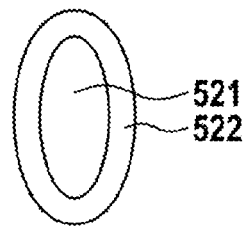
FIG. 13 shows an embodiment with oval or elliptical sensor electrodes.

FIG. 13 shows an embodiment with oval or elliptical sensor electrodes. The first sensor electrode 521 has an oval or elliptical shape. It is surrounded by second sensor electrode 522, which also has an oval or elliptical shape.

The shapes above only give some examples. Basically, the sensor switch may have any suitable shape, provided that there is a first sensor electrode which is at least partially surrounded by a second sensor electrode. Preferably, the second sensor electrode must not completely surround the first sensor electrode, but it should surround the sensor electrode at least partially. If it only partially surrounds the first sensor electrode, water detection in areas where no second sensor electrode is provided, is not possible.

Figure 14:
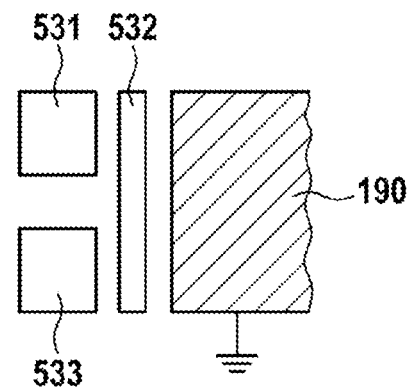
FIG. 14 shows an embodiment with a split first sensor electrode.

In FIG. 14, another embodiment is shown with a split first sensor electrode. The first sensor electrode includes a first section 531 and a second section 533. In close proximity to both sections of the first sensor electrode, a common signal electrode 532 is provided. The second sensor electrode is also required to form a functioning sensor switch, but is not shown in this Figure, as this only relates to the first sensor electrode.

Figure 15:
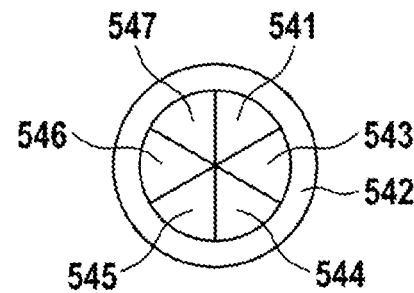
FIG. 15 shows a first sensor electrode split into six equal sections.

FIG. 15 shows a first sensor electrode split into six equal sections which are arranged as arch segments. The first sensor electrode includes sections 541, 543, 544, 545, 546, 547. The second sensor electrode 542 surrounds the first sensor electrode sections.

Figure 16:
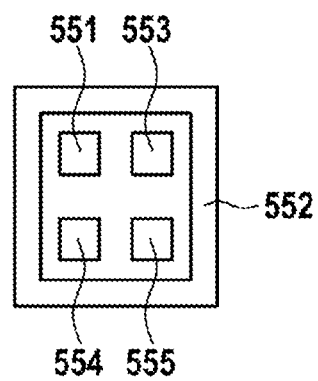
FIG. 16 shows a further embodiment with split first sensor electrodes.

FIG. 16 shows a further embodiment with split first sensor electrodes. The first sensor electrode includes four rectangular sections 551, 553, 554, 555 which are surrounded by second sensor electrode 552.

In the split sensor electrode embodiments disclosed herein, preferably the first sensor electrode sections are individually connected to filtering and evaluation circuits as shown herein, such that it can be detected which sensor electrode has been touched by a finger. This allows to implement multi-pole or multi-function switches. For example, by touching the first sensor electrode section 551 by a finger, a first device may be switched on, whereas it may be switched off by touching second first sensor electrode section 553.

Figure 17:
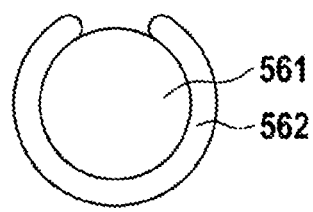
FIG. 17 shows partially surrounding sensors.

FIG. 17 shows a sensor where the second sensor electrode 562 only partially surrounds the first sensor electrode 561, leaving a small gap.

Figure 18:
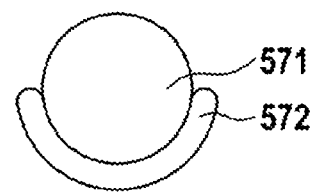
FIG. 18 shows further partially surrounding sensors.

FIG. 18 shows a sensor where the second sensor electrode 572 only partially surrounds the first sensor electrode 571, leaving a larger gap.

Figure 19:
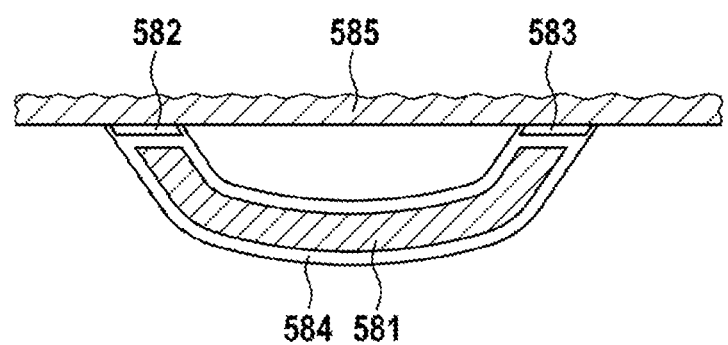
FIG. 19 shows a sensor door handle.

FIG. 19 shows a sensor handle 584 like a door handle which may be used in cars, where the sensor unlocks the door or activates some electronic de-vices in the car. The sensor handle 584 may be mounted to a wall or a car 585. A first sensor electrode 581 is on the handle and two second sensor electrodes 582 and 583 are at the end of the handle close to the car. This makes the sensor in-sensitive to water flowing down the car 585.

Figure 20:
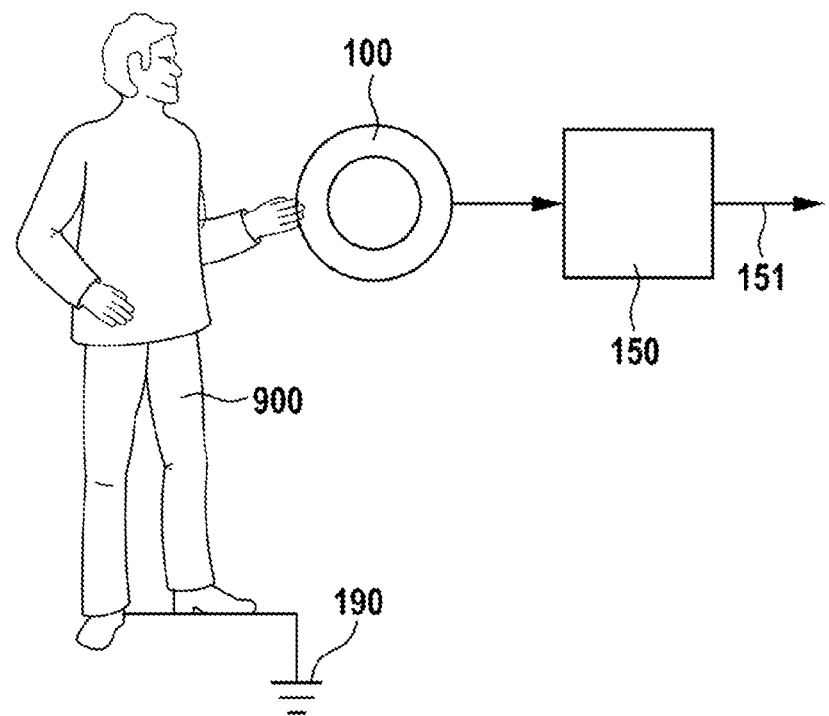
FIG. 20 shows the basic function of the sensor.

In FIG. 20, the basic function of the sensor is shown. A person 900 standing on a floor which basically refers to ground 190 touches the sensor 100. The signal of the sensor signal 100 is evaluated by an evaluation circuit 150 and generates an output signal 151. The evaluation circuit 150 is referred by its housing and the environment back to the same ground 190, as where the person is.

It will be appreciated to those skilled in the art having the benefit of this disclosure that this invention is believed to provide a capacitive sensor switch. Further modifications and alternative embodiments of various aspects of the invention will be apparent to those skilled in the art in view of this description. Accordingly, this description is to be construed as illustrative only and is provided for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

LIST OF REFERENCE NUMERALS 100 sensor switch
101 housing
150 evaluation circuit
151 output signal
190 ground
210 first sensor electrode
211 first signal electrode
220 second sensor electrode
221 second signal electrode
230 printed circuit board
240 printed circuit board
241 electronic components
242 mold
250 evaluation and control circuit
251 switch signal
252 error signal
261 first signal generator
262 first sensor circuit
271 second signal generator
272 second sensor circuit
310 body capacitance
311 body resistance
320 first water capacitance
330 second water capacitance
401 time axis
402 signal voltage axis
411-415 sensor switch with water drop
420 diagram of attenuation signal of first sensor electrode
421-425 signal of first sensor electrode
430 diagram of attenuation signal of second sensor electrode
431-435 signal of second sensor electrode
440 diagram of cross coupling signal of first to second sensor electrode
441-445 signal of first to second sensor electrode
451-454 sensor switch with water drop and finger
460 diagram of attenuation signal of first sensor electrode
461-464 signal of first sensor electrode
470 diagram of attenuation signal of second sensor electrode
471-474 signal of second sensor electrode
480 diagram of cross coupling signal of first to second sensor electrode
481-484 signal of first to second sensor electrode
501 first sensor electrode
502 second sensor electrode
511 first sensor electrode
512 second sensor electrode
521 first sensor electrode
522 second sensor electrode
531 first section of first sensor electrode
532 common signal electrode of first sensor electrode
533 second section of first sensor electrode
541, 543, 544, 545, 546, 547 sections of the first sensor electrode
542 second sensor electrode 551, 553, 554, 555 rectangular sections of first sensor electrode
552 second sensor electrode
561 first sensor electrode
562 partially surrounding second sensor electrode
571 first sensor electrode
572 partially surrounding second sensor electrode
581 first sensor electrode
582 second sensor electrode one
583 second sensor electrode two
584 handle
585 car
601 microcontroller
602 first input pin
603 capacitor
604 first resistor
605 second resistor
606 second input pin
607 capacitor
608 first resistor
609 second resistor
610 series resistor
611 capacitor
612 series resistor
613 capacitor
615 output pin
616 first analog input
617 second analog input
618 first analog output
619 second analog output
620, 621 digital output
625 bias voltage
701 bandpass filter
702 sensor circuit
703 subtracting circuit
704 comparator
705 lowpass filter
706 adder
709 output signal
803 combining circuit
804 comparator
900 person
910 finger
950 water gantry

The invention claimed is:

1. A sensor switch comprising:
a first sensor electrode and a second sensor electrode disposed in a common plane, the second sensor electrode at least partially surrounding the first sensor electrode;
a first signal generator capacitively coupled to the first sensor electrode and capacitively coupled to the second sensor electrode;
a first sensor circuit coupled to the first sensor electrode;
a second sensor circuit coupled to the second sensor electrode;
an evaluation and control circuit connected to the first sensor circuit and the second sensor circuit and configured to receive signals from the first and second sensor circuits;
wherein the evaluation and control circuit is configured:
(1a) to derive a first sensor electrode attenuation signal indicating a signal attenuation at the first sensor electrode, and a second sensor electrode attenuation signal indicating a signal attenuation at the second sensor electrode, and
(1b) to generate a switch output signal if the signal attenuation at the first sensor electrode as indicated by the first sensor electrode attenuation signal is higher than the signal attenuation at the second sensor electrode as indicated by the second sensor electrode attenuation signal.

2. A sensor switch comprising:
a first sensor electrode and a second sensor electrode at least partially surrounding the first sensor electrode, the first and second sensor electrodes being disposed in a common plane;
a first signal generator capacitively coupled to the first sensor electrode;
a second signal generator capacitively coupled to the second sensor electrode;
a first sensor circuit coupled to the first sensor electrode;
a second sensor circuit coupled to the second sensor electrode; and
an evaluation and control circuit connected to the first sensor circuit and the second sensor circuit and configured to receive signals from the first and second sensor circuits,
wherein the evaluation and control circuit is configured:
(2a) to derive a first sensor electrode attenuation signal indicating a signal attenuation at the first sensor electrode, a second sensor electrode attenuation signal indicating a signal attenuation at the second sensor electrode, and a cross-coupling signal indicating a signal transmission between the first sensor electrode and the second sensor electrode, and
(2b) to generate a switch output signal if the signal attenuation at the first sensor electrode as indicated by the first sensor electrode attenuation signal is higher than the signal attenuation at the second sensor electrode as indicated by the second sensor electrode attenuation signal and the cross-coupling signal indicates a low cross-coupling with a level of the cross-coupling signal being below a predetermined high threshold value.

3. A sensor switch according to claim 1, wherein the evaluation and control circuit is configured to generate a signal indicating a presence of water at a switch if the second sensor electrode attenuation signal indicates a high attenuation.

4. A sensor switch according to claim 2, wherein the evaluation and control circuit is configured to generate a signal indicating a presence of water at the switch if at least one of the following conditions is met:
(4A) the first sensor electrode attenuation signal indicates a first low attenuation, the second sensor electrode attenuation signal indicates a second high attenuation that is higher than the first low attenuation, and the cross-coupling signal indicates the low cross-coupling with the level of the cross-coupling signal being below the predetermined high threshold value, and
(4B) the first sensor electrode attenuation signal indicates the first low attenuation, the second sensor electrode attenuation signal indicates a second low attenuation, and the cross-coupling signal indicates a high cross-coupling with the level of the cross-coupling signal being above the predetermined high threshold value.

5. A sensor switch according to claim 2, wherein the evaluation and control circuit is further configured to generate a switch output signal or an error signal if the first sensor electrode attenuation signal indicates a high attenuation and one of the following conditions is met:

(5A) the signal attenuation at the second sensor electrode as indicated by the second sensor electrode is lower than the signal attenuation at the first sensor electrode as indicated by the first sensor electrode attenuation signal, and the cross-coupling signal indicates a high cross-coupling with the level of the cross-coupling signal being above the predetermined high threshold value, and (5B) the second sensor electrode attenuation signal indicates a high signal attenuation at the second sensor electrode and the cross-coupling signal indicates a low cross-coupling.

6. A sensor switch according to claim 1, wherein the second sensor electrode is surrounding the first sensor electrode at at least 50% of a circumference of the first sensor electrode.

7. A sensor switch according to claim 1, wherein the second sensor electrode is completely surrounding the first sensor electrode.

8. A sensor switch according to claim 1, wherein either the sensor switch is mounted in or on a grounded surface, or the second sensor electrode is at least partially surrounded by a ground ring or a ground plane.

9. A sensor switch according to claim 1, wherein the evaluation and control circuit is configured to have a dynamic threshold dependent on signals received from the first and second sensor electrodes to detect an increasing electrical load to the first sensor electrode.

10. A sensor switch according to claim 2, configured to have the first signal generator and the second signal generator switch "on" alternately.

11. A sensor switch according to claim 2, wherein the first signal generator and the second signal generator are configured to generate different signals.

12. A sensor switch according to claim 11, wherein the different signals are characterized by different frequencies, different modulations, or different encodings.

13. A sensor switch according to claim 1, wherein the second sensor electrode is surrounding the first sensor electrode at at least 70% of a circumference of the first sensor electrode.

14. A sensor switch according to claim 2, wherein the second sensor electrode is completely surrounding the first sensor electrode.

15. A sensor switch according to claim 2, wherein either the switch is mounted in or on a grounded surface, or the second electrode is at least partially surrounded by a ground ring or a ground plane.

16. A sensor switch according to claim 2, wherein the evaluation and control circuit is configured to have a dynamic threshold dependent on signals received from the first and second sensor electrodes to detect an increasing electrical load to the first sensor electrode.

17. A sensor switch according to claim 4, configured to have the first signal generator and the second signal generator switch "on" alternately.

18. A sensor switch according to claim 5, configured to have the first signal generator and the second signal generator switch "on" alternately.

19. A sensor switch according to claim 4, wherein the first signal generator and the second signal generator are configured to generate different signals.

20. A sensor switch according to claim 19, wherein the different signals are characterized by different frequencies, different modulations, or different encodings.

* * * * *